United States Patent [19]
Slinker et al.

[11] Patent Number: 5,930,313
[45] Date of Patent: Jul. 27, 1999

[54] METHOD AND APPARATUS FOR TRANSPORTING AN INTENSE ION BEAM

[75] Inventors: Steven P. Slinker, Arlington; Richard F. Hubbard, Burke, both of Va.; Martin Lampe, University Park, Md.; Glenn Joyce, Alexandria, Va.

[73] Assignee: The United States of America as represented by the Secretary of the Navy, Washington, D.C.

[21] Appl. No.: 07/801,248

[22] Filed: Dec. 3, 1991

[51] Int. Cl.⁶ ................................................. G21B 1/02
[52] U.S. Cl. ............................................ 376/127; 376/122
[58] Field of Search ................................... 376/127, 128, 376/129, 130, 103–107, 122; 89/1.11

[56] References Cited

U.S. PATENT DOCUMENTS

| | | | |
|---|---|---|---|
| 3,274,435 | 9/1966 | Kerst | 376/127 |
| 3,445,333 | 5/1969 | Lecomte | 376/107 |
| 3,663,362 | 5/1972 | Stix | 376/127 |
| 3,808,432 | 4/1974 | Ashkin | 376/107 |
| 4,217,171 | 8/1980 | Schaffer | 376/125 |
| 4,240,873 | 12/1980 | Linlor | 376/107 |
| 4,246,067 | 1/1981 | Linlor | 376/107 |
| 4,392,111 | 7/1983 | Rostoker | 376/129 |
| 4,401,618 | 8/1983 | Salisbury | 376/106 |
| 4,700,068 | 10/1987 | McClung et al. | 250/251 |
| 4,743,804 | 5/1988 | Frost et al. | 376/127 |
| 4,780,647 | 10/1988 | Friedman et al. | 376/127 |
| 5,053,622 | 10/1991 | Kessler | 89/1.11 |

OTHER PUBLICATIONS

J.D. Miller et al., Observation of Plasma Wake–Field Effects During High–Current Relativistic Electron–Beam Transport, 67 Physical Review Letters 1747 (No. 13, Sep. 23, 1991).

Han Sup Uhm et al., Theory of Wake–Field Effects of a Relativistic Electron Beam Propagating in a Plasma, Phys. Fluids B, 3 (7), Jul., 1991.

G. Joyce et al., Relativistic Beam Propagation Through Diffuse Plasmas, Proceedings of The 1988 Annual Propagation Physics Review of the Strategic Defense Initiative Organization and of the Defense Advanced Research Projects Agency and of Army, Navy, Air Force, vol. I, p. 377 (Dec., 1988).

Winterberg, "Focusing of an Intense Relativistic Electron Beam by a Hollow Conical Laser Beam", Z. Naturforsch. 30a, 976–980 (1975).

Winterberg, J. Plasma Physics (1980) vol. 24, part 1, pp. 1–14.

*Primary Examiner*—Daniel D. Wasil
*Attorney, Agent, or Firm*—Thomas E. McDonnell; Edward F. Miles

[57] ABSTRACT

A method and apparatus for transporting a positive ion beam to a distant target. An ion channel is created as a path to the target, and the beam injected into the channel at a mildly-relativistic beam velocity. Because the beam is mildly-relativistic, the electric field caused by its positive charge propagates well in advance of the beam, attracting free electrons in the plasma channel and pulling them into the beam along its axis of propagation. The current which is initiated by this precursor electron flow, is sustained during the duration of the beam, and is then a combination of the beam current and additional current carried by the electrons within the channel. As a result, a magnetic flux circulates annularly about the beam of a sufficient magnitude to pinch the beam.

10 Claims, 3 Drawing Sheets

METHOD AND APPARATUS FOR TRANSPORTING AN INTENSE ION BEAM

BACKGROUND OF THE INVENTION

The invention pertains to plasma physics, and in particular to and transportation and use of positively charged particle beams.

Particle beams of positively charged atoms have potentially a number of useful applications, among which are thin film deposition, semiconductor doping, use as a general laboratory tool, a source of pulsed neutrons (i.e. by impacting a suitable target), shock hardening of materials, advanced military weaponry, and, most interestingly, as the trigger in a nuclear fusion reactor. Unfortunately, a number of these applications require that after the beams are created in particle accelerators, they must travel a considerable distance to their targets. Because the beam is charged, and because the beam's atoms have significant thermal energy, the beam tends to dissipate unless steps are taken to hold it together. Several ways exist to do this, classified broadly as external and internal confinement approaches.

External confinement uses external magnetic or electrostatic lenses to focus the beam. An example is ballistic focusing, in which a lens focuses the beam at one point in space, beyond which it again expands; thus to maintain the beam intact over an appreciable distance requires a series of lens elements distributed along the path between the particle accelerator which creates the beam, and the beam's target, to repeatedly refocus the beam.

External confinement has several inherent drawbacks. Because the velocity of atoms in the beam is not uniform, a single lens used for ballistic transport tends to focus different atoms of different velocities at different spots, causing a net result akin to a blurred optical image. Therefore, the use of ballistic focusing imposes severe constraints on longitudinal beam dispersion, which are difficult to satisfy in accelerators. Furthermore, ballistic transport can only be used over limited distances.

Use of external confinement to transport an ion beam over long distances, or maintaining the beam at a small radius requires a sequence of lens elements. Such a large number of lenses requires a substantial investment in hardware and money. Lensing of this kind cannot be used in a physically hostile environment because the lensing hardware would be destroyed. This poses a particularly difficult problem if one wishes to use ion beams in a nuclear fusion reaction chamber. The chamber will contain high radiation levels, and extremely hot fragments from fusion reactions which would rapidly destroy any lensing apparatus, or for that matter any workers tasked with replacing the apparatus.

Internal confinement consists of providing a medium which sufficiently neutralizes the beam space charge, and insuring that an axial current flows of sufficient magnitude that it creates an azimuthal magnetic flux which confines the beam and prevents it from diverging, i.e. "pinches" the beam. A relativistic electron beam injected into an initially neutral gas will ionize the gas and generate electromagnetic fields which self-pinch the beam. This has been demonstrated in both high density gases (resistive regime) and low density gases (ion-focused regime). Ion-focused regime propagation is also possible using preionized plasma channels. Such channels can be generated by a laser or a low energy electron beam in any of a number of known ways.

Internal confinement, i.e. pinching, has none of the hardware drawbacks of external confinement. Unfortunately, it is widely believed that positive ion beams cannot self-pinch in this manner. Calculations indicate that relativistic ion beams propagating into a neutral gas in the resistive regime would ionize a plasma channel so quickly and so extensively that plasma currents would largely cancel the magnetic pinching flux which the ion beam generates on itself. The ion-focused regime mechanism, in which the channel electrons are expelled and a relativistic electron beam is pinched by the resulting positive ion channel, cannot work for a positive ion beam. Thus for ion beams, attempts at self-pinching appear self-defeating.

A variation of internal confinement is to generate a current-carrying guided electric discharge to provide the pinching magnetic field. In this method, a laser partially ionizes the gas along the desired path for the beam. A high voltage is applied at opposite ends of the ionization path. This causes further ionization by avalanche breakdown and induces a strong axial current which pinches the beam. Laser-guided discharges are cumbersome for many applications and cannot be used in many parameter regimes of interest.

A variation on internal confinement, counter-propagation using a relativistic electron beam, can in theory provided pinched propagation of an ion beam. In counter-propagation a self-pinched relativistic electron beam and a positive ion beam are propagated along the same axis but in opposite directions, i.e. through one another. Being oppositely directed and of opposite charge, each beam sets up reinforcing pinching fluxes which, together, could hold the ion beam pinched.

Accelerators to generate the required electron beams are large and expensive. Also, counter-propagation suffers the practical disadvantage that the ion beam's target will obstruct the oppositely directed electron beam. One could try circumventing this by using strong bending magnets to curve the electron beam in front of the target and into the beam. But this is technically difficult, and would require expensive magnets to be placed in a physically hostile environment, the major drawback of external confinement.

SUMMARY OF THE INVENTION

Accordingly, an object of the invention is to permit the transport of positive ion beams in a manner that is relatively simple, effective, and inexpensive.

Another object is to provide a way to transport positive ion beams which are useful in a wide range of practical applications, including those applications practiced in hostile physical environments, such as a nuclear fusion reaction chamber.

Another object is to permit transporting an ion beam without the need of any expensive external focusing hardware.

Another object is to permit a positive ion beam to self-pinch itself.

In accordance with these and other objects made apparent hereinafter, the invention concerns a method and apparatus whereby a plasma channel is created in a gas, and a positive ion beam injected into the channel at a mildly-relativistic mean ion velocity, such that a potential well is set up in front of the beam which draws channel electrons toward the beam head. Despite the general belief that an ion beam cannot be pinched, calculations and numerical simulations by the inventors indicate that if the ion beam velocity is well below the speed of light, the electric field generated by the beam propagates ahead of the beam and draws free electrons from the channel axially into the head of the beam. These free electrons thus flow into the beam axially opposite to the direction of the beam. Being of opposite charge to the beam, this flow of electrons sets up a current which is in the same direction as the ion beam current and thus an azimuthal magnetic flux which is maintained during the passage of the beam, and pinches the beam.

These and other objects are more fully understood from the following detailed description of particular embodiments of the invention. It is understood, however, that changes and modifications to the embodiments will occur to those skilled in this art that do not affect the spirit of the invention, nor exceed its scope, as expressed in the appended claims. Accordingly, the invention is described with particular reference to the accompanying drawings, wherein:

DETAILED DESCRIPTION

Figure 1:
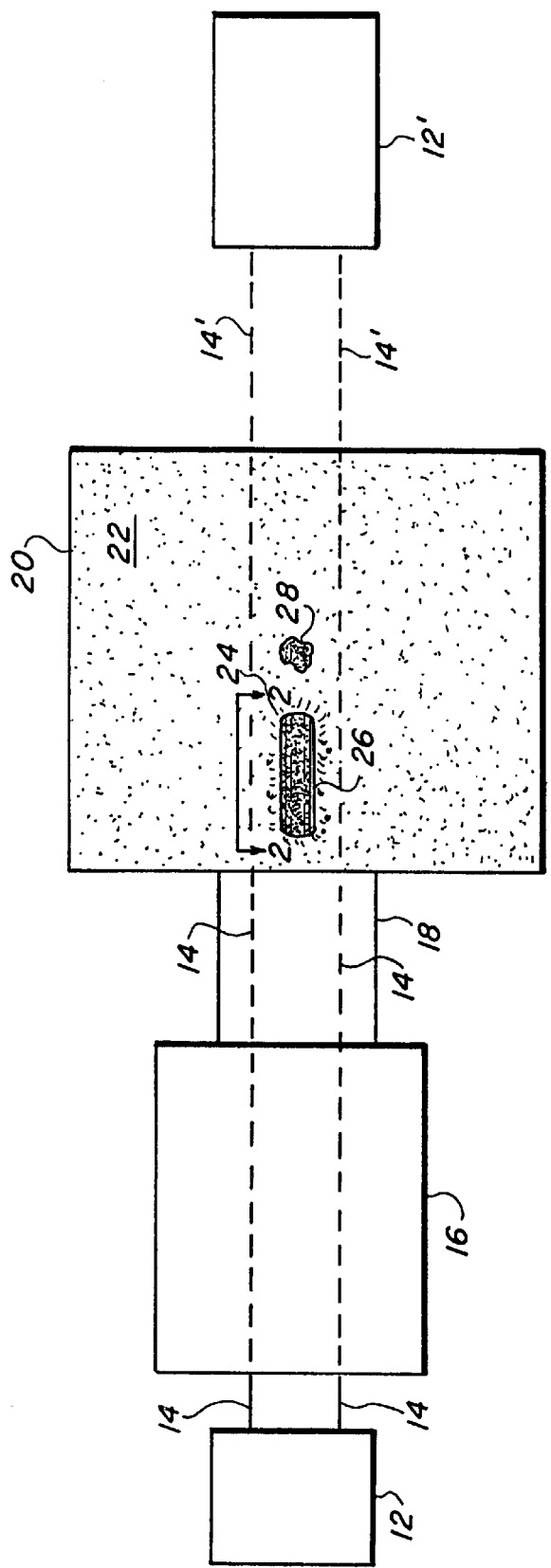
FIG. 1 is a schematic illustrating an embodiment of the invention.

With reference to the drawing figures, wherein like numbers indicate like parts throughout the several views, FIG. 1 shows an apparatus according to the invention. A laser 12 produces an output 14 which traverses members 16 and 18 to reach chamber 20 containing target 28. Chamber 20 contains a gas 22 which laser output 14 ionizes to form a plasma channel 24. Member 16 is a particle accelerator, which generates a pulse of positive ions 26 directed through drift passage 18 into chamber 20 and plasma channel 24. Member 18 is optional, and could be any conventional means for maintaining an ion beam focused, for example a magnetic lens. FIG. 1 shows ion beam 26 inside chamber 20, where it has propagated since ejection by accelerator 16, heading in the direction of target 28. Target 28 could be any of a number of materials, ranging from a tool or structural metal which beam 26 will harden by impact, to a fuel pellet for nuclear fusion.

In general, it is necessary to maintain a vacuum in accelerator 16, and also in the drift region 18. To accomplish this, chamber 20 may be separated from the drift region 18 by a thin foil through which the beam passes. Alternatively, there may be an aperture between 18 and 20, in which case the vacuum could be maintained by differential pumping in region 18. For certain applications, notably heavy ion fusion, it is necessary to strip the beam into a high charge state at the entrance to chamber 20. This will occur if the beam passes through a foil or gas puff.

Figure 2:
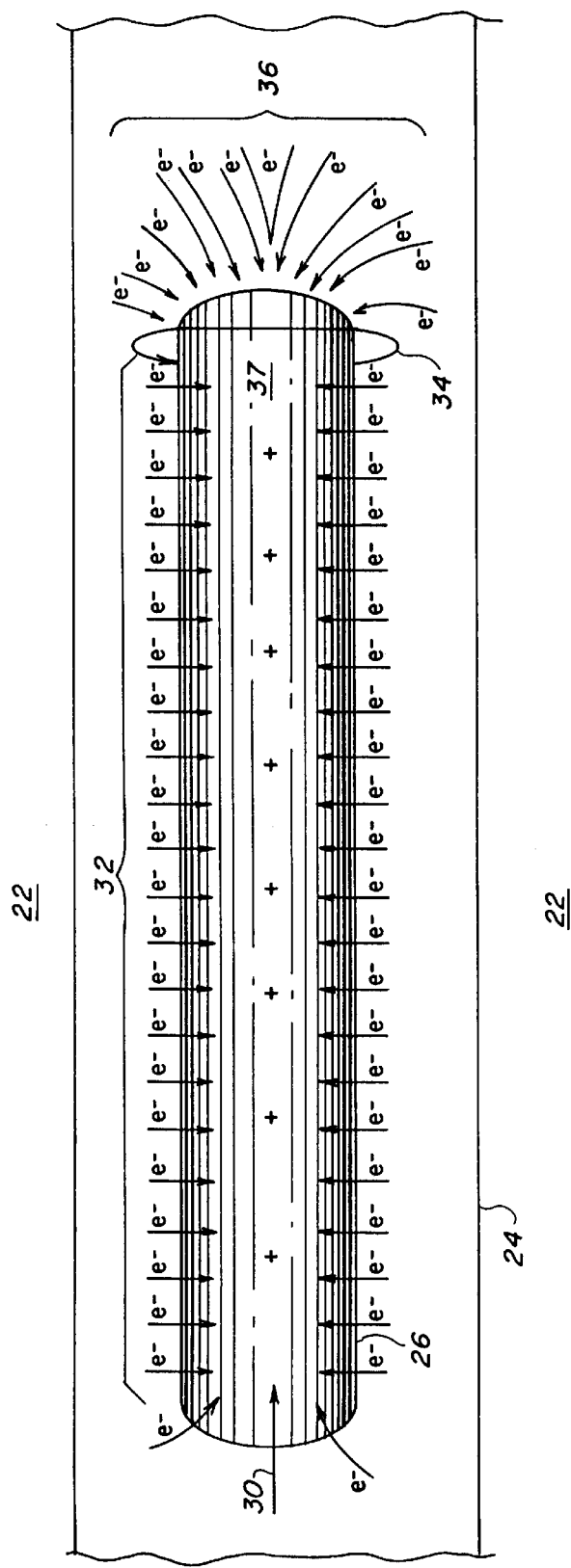
FIG. 2 is a schematic illustrating the physics of an ion beam pinched according to the invention. The beam is viewed in the direction of lines 2—2 of FIG. 1.

FIG. 2 illustrates the pinching of ion beam 26. Beam 26 travels through plasma channel 24 at a mildly-relativistic velocity indicated by arrow 30. Because velocity 30 is well below the speed of light, the electric field generated by the ions in beam 26 propagates ahead of beam 26. Being ahead of the beam, this electric field pulls free electrons 36 from the plasma axially towards head 37 of beam 26. This establishes a flow of electrons along the same axis (30) along which beam 26 propagates, but in the opposite direction. Since the electron charge is opposite to the ion charge, this electron current flows in the same direction as the ion beam current. Because of Lenz's law, the current which is initially established by the electron flow is maintained during the passage of the ion beam. As beam 26 traverses plasma channel 24, it also pulls in free electrons 32 from the channel. This tends to establish charge equilibrium within beam 26, which is necessary to eliminate strong electrostatic self-repulsion of the beam ions. The net current $I_n$, i.e. the sum of the ion beam current and the current carried by plasma electrons, remains essentially frozen at the magnitude initially set by the precursor electron flow.

The conditions under which a charged particle beam will be pinched are generally known to workers in this field, and are given by the pinch equation:

$$I_n > (17kA)(\epsilon/a)^2 \beta\gamma(m_i/m_e)(1/Q_i)$$

where:

a is the beam radius.

$\epsilon$ is the emittance of the particle beam, a standard measure of the quality of such a beam (i.e. of how well the velocities of the beam particles are aligned, and hence how much the beam will tend to diverge during propagation). p1 $\beta$=v/c, where v is the mean velocity of the beam, and c is the speed of light. Thus $\beta$ is the speed at which the beam travels, expressed as a fraction of the speed of light.

$\gamma = (1-\beta^2)^{-\frac{1}{2}}$ $m_i$ is the mass of the particles which constitute the beam.

$m_e$ is the mass of an electron.

$Q_i$ is the charge of the particles which constitute the beam, expressed in multiples of electron charge. (For example, for heavy ion fusion it may be appropriate to use ions such as bismuth, which are stripped to an average ionization state $Q_i$=50.)

To ensure pinching, the charge density $\rho_p$ of plasma channel 24 must be larger than the charge density $\rho_b$ of beam 26. A minimum condition for this would be that the density $\rho_g$ of atoms in gas 22 exceed $\rho_b/Q_p$, where $Q_p$ is the average number of electrons removed from atoms in gas 22. (Beam 26 may itself contribute to the ionization of channel 24 by collisions, thus relaxing the demands on laser 12 to fully ionize the channel.) One skilled in the art will know how to create these conditions, after having been instructed by this application in the desirability of so doing. Nominally, a gas pressure in chamber 20 of between $10^{-3}$ to 1 Torr should suffice. The term $\beta$ must not be so close to the speed of light that the electric field from beam 26 cannot significantly outrun the beam itself. Numerical simulations indicate that useful pinching will occur at least within the range $\beta$=0.3 to 0.8, corresponding to an energy of 0.05 to 0.66 A measured in GeV, where A is the atomic weight of an ion in the beam. The channel radius should be one to a few times the beam radius in order to supply electrons outside the beam for charge neutralization, and a well-collimated precursor electron current for pinching.

Gas 22 and the constituents of ion beam 26 can be any molecular or atomic species. Member 12 can be any type of laser which effectively ionizes the gas 22. This will occur if the laser frequency is well matched to the quantum states of gas 22, for example a KrF laser used to create a plasma channel in an organic gas such as benzine, or a device such as a free electron laser which can be tuned to the optimal frequency for the gas 22 in chamber 20. Alternatively, a laser or microwaves source can be used to trigger an avalanche breakdown in the gas in order to create a plasma channel. A third technique is to use a low-energy (about a few hundred volts), low current (about a few amps) electron beam, guided by a weak magnetic field (about 50 G) to create the plasma channel.

A numerical simulation was done to investigate the working of the invention. The simulation used the FRIEZR beam simulation code, which was developed by workers at the Naval Research Laboratory in Washington, D.C., in support of their research. It is one of a number of numerical codes available for simulating charged particle beams. The parameters of the simulated beam were:

Ion beam energy of 10 GeV, roughly corresponding to $\beta=0.3$ for bismuth.

$I_b Q_b = 5$ kAmp upon entry into the channel.

$m_i = 209$ times the proton mass (i.e. bismuth).

$\epsilon = 10^{-3}$ rad-cm.

Beam pulse duration of 10 nsec.

Radius of ion beam: 1.0 cm.

Radius of the plasma channel: 1.5 cm.

The channel electron charge, per unit length, was five times the beam charge.

Figure 3:
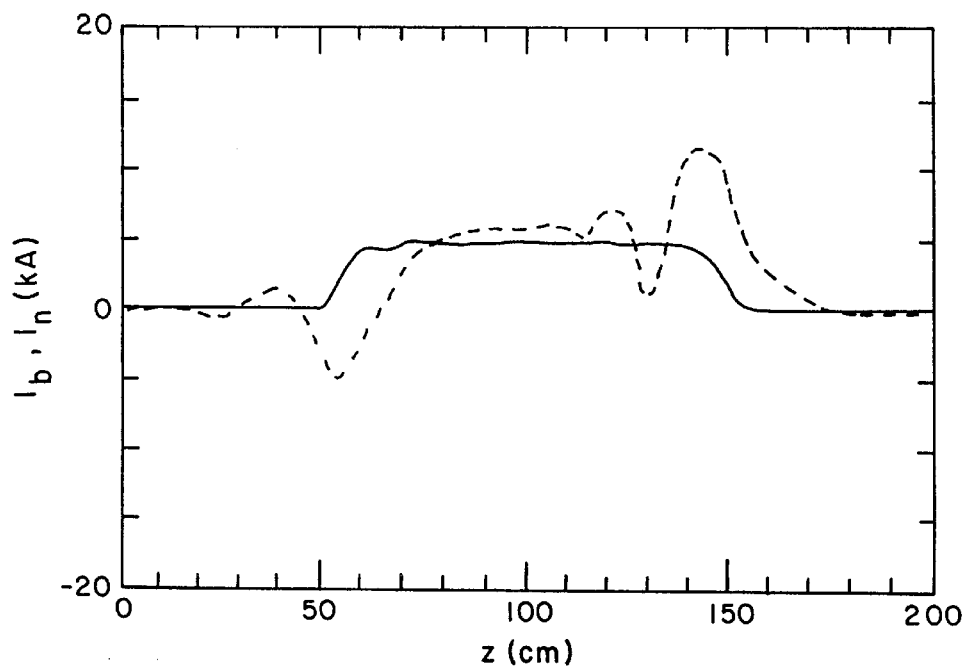
FIGS. 3 and 4 are graphs illustrating the results of a numerical simulation done to test the principles of the invention.
Figure 4:
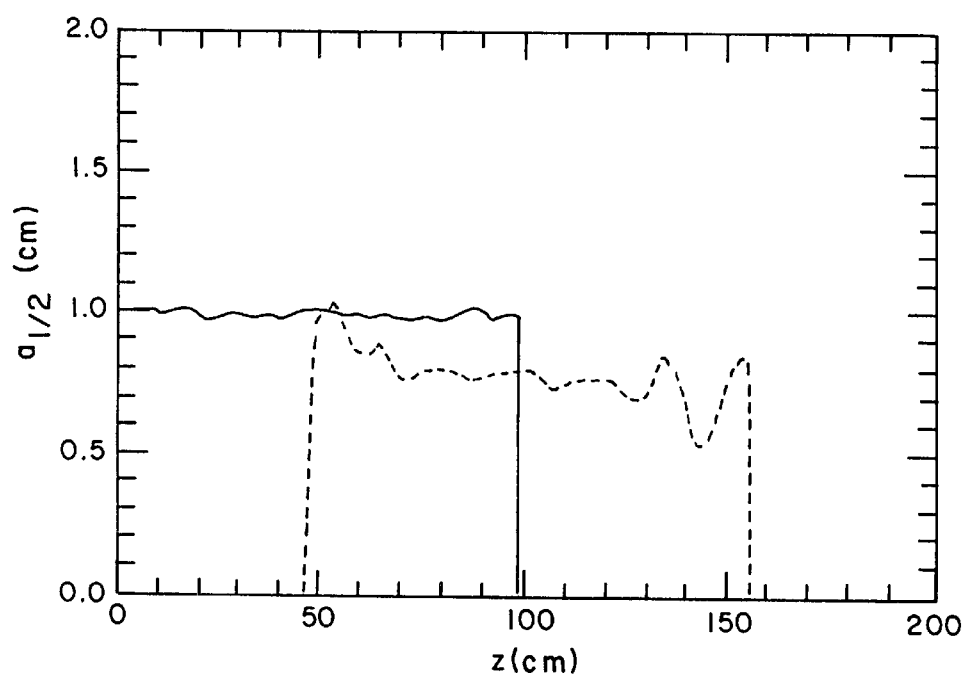

FIGS. 3 and 4 show the results of that simulation. In FIG. 3, the solid line indicates beam current, and the dashed line net current, at a time 6 nsec after the tail of the ion pulse had passed point z=0. As seen in the figure, the two are of the same order. The net current is well in excess of the requirement from the pinch equation (for $I_n$, above), which should indicate good pinching. FIG. 4 plots the "half radius" of the beam, i.e. the radius which contains half the beam current, at the time when the beam tail had passed z=0 (solid curve), and 6 nsec thereafter (dashed curve). As seen from these curves, the half radius stayed roughly the same during this time, and in fact the half radius contracted, indicating good pinching.

Referring again to FIG. 1, the laser could be positioned differently, for example at the opposite end of chamber 20 as illustrated in FIG. 1 as laser 12'. Here, laser output 14' goes directly into chamber 20, where it creates plasma channel 24 in the manner discussed above concerning laser 12. Although laser 12' is advantageously positioned closer to chamber 20, it suffers the disadvantage that target 28 obscures its output 14'. This would be unacceptable if target 28 is sensitive to light at the frequency of laser 12', or if it is desired that the diameter of plasma channel 24 be close to that of the target.

The invention has been described in what is considered to be the most practical and preferred embodiments. It is recognized, however, that obvious modifications may occur to those with skill in this art. Accordingly, the scope of the invention is to be discerned solely by reference to the appended claims, wherein:

We claim:

1. An apparatus for transporting an intense ion beam comprising:

means for creating a plasma channel in a gas;

means for injecting a positive ion beam into said channel at a mildly-relativistic mean velocity;

wherein the magnitude and direction of current caused by propagation of said beam in said channel, the magnitude of charge density in said beam, the magnitude of charge density in said plasma channel, and said mean velocity of ions in said ion beam are effective to create net currents within said beam sufficient to pinch said ion beam.

2. The apparatus of claim 1, wherein said means for creating comprises a laser means for ionizing said gas.

3. The apparatus of claim 1, wherein said velocity, expressed as a fraction $\beta$ of the speed of light, is less than about 0.8.

4. The apparatus of claim 3, wherein said $\beta$ is between about 0.3 and 0.8.

5. The apparatus of claim 2, wherein said gas is an organic gas, and said laser is a KrF laser.

6. A method for transporting an intense ion beam comprising:

creating a plasma channel in a gas;

injecting a positive ion beam into said channel at a mildly-relativistic mean velocity;

wherein the magnitude and direction of current caused by propagation of said beam in said channel, the magnitude of charge density in said beam, the magnitude of charge density in said plasma channel, and said mean velocity of ions in said ion beam are effective to create net currents within said beam sufficient to pinch said ion beam.

7. The method of claim 6, wherein said step for creating uses a laser for ionizing said gas.

8. The method of claim 6, wherein said velocity, expressed as a fraction $\beta$ of the speed of light, is less than about 0.8.

9. The method of claim 8, wherein said $\beta$ is between about 0.3 and 0.8.

10. The method of claim 7, wherein said gas is an organic gas, and said laser is a KrF laser.

* * * * *